(12) United States Patent
Bauer, Jr. et al.

(10) Patent No.: US 7,078,247 B2
(45) Date of Patent: Jul. 18, 2006

(54) EARLY DETECTION OF CONTACT LINER INTEGRITY BY CHEMICAL REACTION

(75) Inventors: Lawrence Bauer, Jr., Pine Bush, NY (US); Kenneth Giewont, Hopewell Junction, NY (US); Subramanian Iyer, Mount Kisco, NY (US); Bosang Kim, Mount Vernon, NY (US); Jeffrey Lloyd, Poughkeepsie, NY (US); Peter Locke, Hopewell Junction, NY (US); James Norum, Brewster, NY (US); Paul Parries, Wappingers Falls, NY (US); Kent Way, Poughkeepsie, NY (US); Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 310 days.

(21) Appl. No.: 10/250,144

(22) Filed: Jun. 6, 2003

(65) Prior Publication Data

US 2005/0010455 A1    Jan. 13, 2005

(51) Int. Cl.
*H01L 21/66* (2006.01)
*H01L 21/00* (2006.01)
*H01L 21/4763* (2006.01)
*H01L 21/44* (2006.01)
*G01R 31/26* (2006.01)

(52) U.S. Cl. .................... 438/14; 438/153; 438/637; 438/672

(58) Field of Classification Search .............. 438/14, 438/153, 637, 672; 250/306
See application file for complete search history.

(56) References Cited

U.S. PATENT DOCUMENTS

| 4,397,714 | A | | 8/1983 | Janata et al. ............... 205/775 |
| 4,799,991 | A | * | 1/1989 | Dockrey .................... 438/719 |
| 4,881,591 | A | | 11/1989 | Rignall ...................... 165/206 |
| 5,256,566 | A | * | 10/1993 | Bailey ........................ 438/684 |
| 6,200,023 | B1 | * | 3/2001 | Tay et al. ................... 374/161 |
| 6,278,129 | B1 | | 8/2001 | Sugasawara et al. .......... 257/48 |
| 6,893,953 | B1 | * | 5/2005 | Hoshino et al. ............ 438/618 |
| 6,905,801 | B1 | * | 6/2005 | Liang et al. .................. 430/5 |
| 2004/0082142 | A1 | * | 4/2004 | Hansel et al. ............... 438/424 |

OTHER PUBLICATIONS

Stanley Wolf Ph.D. and Richard N. Tauber Ph.D. in Silicon Processing for the VLSI Era, vol. 1: Process Technology, Lattice Press, 1986, pp. 592-595.*

* cited by examiner

*Primary Examiner*—William M. Brewster
(74) *Attorney, Agent, or Firm*—Ira D. Blecker

(57) ABSTRACT

The integrity of a liner in an interconnect structure or other layer in an integrate circuit is tested in a short time by exposing the liner to a reactive gas that attacks the underlying silicon or other material behind the liner. A weak spot in the liner permits the gas to react with the silicon, which produces a visible area that can be readily identified. The test can be performed in a few hours, in contrast to a period of several months required to complete the process, package the circuit and conduct a burn-in test.

19 Claims, 1 Drawing Sheet

EARLY DETECTION OF CONTACT LINER INTEGRITY BY CHEMICAL REACTION

BACKGROUND OF INVENTION

The field of the invention is integrated circuit processing, in particular forming interconnect structures in the back end or the first metal contact in the front end.

In the course of manufacturing integrated circuits, many tests are performed to verify that the process is within its design parameters. In addition, reliability tests are performed to verify the durability or reliability of the product under stress and time. Preferably, the tests are performed in real time i.e. the result is available immediately. The longer the interval between the construction process and the test result, the longer the time in which the process will continue to be out of specification before it is corrected.

One test that is routinely performed is a "burn-in" test, in which the complete working circuit is placed in a chamber at an elevated temperature while it is operated. The elevated temperature (typically about 140 degrees Centigrade) accelerates chemical reactions and the product degradation, as well as putting thermal stress on mechanical joints, so that the failure rate is accelerated.

This test assesses the performance of the completed circuit and therefore requires that the circuit be completed. The length of time that it takes for a circuit to pass through the back end steps of a fabrication facility is approximately 3–4 months. Thus, this test is not suitable for monitoring the status of an individual step in the process. By the time a step that is out of specification or reliability standard is detected, a large number of lots will have passed through the manufacturing fab and been processed with the incorrect step. Since the circuit has been completed, it is not practical to rework the defective step i.e. removing the layers that were put on after the defective step, re-doing the step in question, and then re-doing all the later steps is not practical.

Various methods of getting results with a shorter turn-around are known, but have various drawbacks.

In one method, a wafer is taken from the line, cut in sections and examined under an electron microscope. This gives a result that reflects the actual state of the process, but is limited to only a few samples and permanently destroys the wafer being tested.

U.S. Pat. No. 4,881,591, for example, illustrates a burn-in oven for performing a thermal stress test. Such a test stresses the circuit and accelerates chemical reactions, so that potential corrosion effects happen much sooner than in actual use, but the results are much too slow to be useful in monitoring the actual state of the parameters on a production line.

U.S. Pat. No. 6,278,129 shows a scheme in which special test structures outside the die are fabricated on a wafer, that are sensitive to corrosion. The structures are tested during the passage of the wafer through the fab to reveal problems caused by the harsh chemicals used in processing. The test structures that are designed to be more sensitive than the real structure and may not be exactly representative of the actual structures in the circuits being fabricated.

The art has long sought a quick test that measures the reliability of the actual structures in the circuit.

SUMMARY OF INVENTION

The invention relates to a method of testing the integrity of a liner in a via or other interconnect, especially the liner for the first metal contact.

A feature of the invention is the application of a corrosive gas that attacks silicon or other material through a liner that is meant to cover the material.

Another feature of the invention is the automated scanning of the tested wafer by a tool ordinarily used for detecting defects.

Another feature of the invention is a non-destructive test mode that provides the ability to continue the processing of a tested wafer.

DETAILED DESCRIPTION

The standard method used in the art of integrated circuit formation is the thermal stress test, in which a sample number of completed, electrically functioning, parts are maintained at an elevated temperature while they are operated. The elevated temperature increases the chemical reactions and the circuit degradation that may be taking place between residual chemicals remaining after the processing that may cause corrosion or other problems and also puts mechanical stress on components. The number of parts that fail after this test is compared with a reference threshold to determine if the batch from which the sample is taken can be sold. The test data are also used to check if the manufacturing process is within specifications and to modify it accordingly when it is out of specification. The test is considered to be destructive, since the circuits that are tested cannot be sold.

Figure 1:
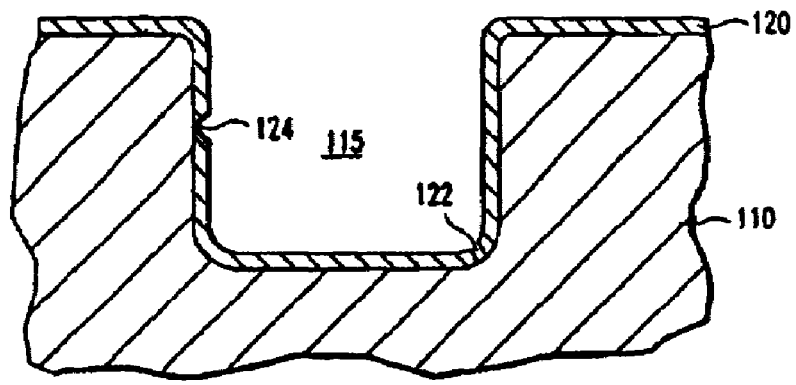
FIG. 1 illustrates a structure for use with the invention.

FIG. 1 illustrates a particular structure that may give rise to component failures. The structure is part of an interconnect in which an interlevel dielectric 110 (which may be SiO2, oxide, or a low-k dielectric such as SILK™) has been put down over a lower level, which may be a lower level of interconnect or the silicon wafer. A trench 115 has been etched extending perpendicular to the plane of the paper. The trench has been lined with a liner 120 that is illustratively a composite of a first layer of Ti followed by a layer of TiN. Many other liner combinations are known in the art, depending on the material that will fill the trench and other considerations.

Two defects are illustrated—a pinhole 122 and a recess 124. Other weaknesses in a liner layer are known, and these two are shown for purposes of illustration.

In a testing method according to the invention, the liner layer (also referred to as a blocking layer) is exposed to a corrosive gas that does not attack (is inert to) the liner material 120 to a significant degree, but does attack the material behind the liner, e.g silicon.

If the liner is defect-free the gas will not penetrate and react with liner 120 and the wafer can proceed to the next step in the fabrication sequence. If the liner has a defect, such as 122 or 124, the gas will react with the defects in 120, or material below the liner and produce some results, such as an expansion of the defect and also some reaction products. Such a result is detected, automatically or manually, and the fabrication process is adjusted accordingly, by changing deposition temperature, gas flow rate, time of deposition, etc.

It is an advantageous feature of the invention that the wafer can be returned to the production line if there are no defects or if the number of defects are less than some threshold. It is another advantage that the wafer can be reworked if the number of defects is above threshold i.e. the liner can be stripped by an appropriate chemical treatment and a new layer deposited. The amount of rework will vary according to the type of structure being tested and the extent of the damage done by the test. For example, it may be necessary to deposit more of the inter-level dielectric to repair the divot left by the test and to repeat the etching step to form the trench before depositing a new liner.

Another advantageous feature of the invention is that the results of the test are available after a short time of a few hours, so that the parameters of the liner process may be adjusted with only a small amount of below-standard product being affected.

In contrast, the conventional thermal stress test requires that the part complete its passage through the fab- which may take three or four months. During that time, a large amount of below-standard material may have accumulated. Further, since the parts have been completed, it difficult and may be prohibitively expensive, to rework the below-standard material. Also, the parts that have undergone the thermal test cannot be sold. Thus, the conventional test suffers from a number of disadvantages compared with the inventive test.

In the case of a Ti/TiN liner for a contact to silicon, a suitable reactive test gas is WF6. WF6 reacts with Si: $2WF6(g)+3Si(s)->2W(s)+3SiF(g)+6H2(g)$. Thus, if there is a defect in the liner, the gas will form solid W in the trench and also expand the size of the defect by consuming the Si below the liner. WF6 is used routinely with the illustrated Ti/TiN liner to form W interconnects according to the reaction $WF6(g)+3SiH4(g)$ Ã¹>$2W(s)+3SiF4(g)+6H2(g)$ and $WF6(g)+H2(g)$ Ã>>>$W(s)+HF$ [where (g) means that the substance is a gas and (s) means that the substance is a solid], so that suitable parameters are well known in the art to expose the Ti/TiN liner to WF6 without damaging the liner by attack from the WF6.

Illustratively, the gas exposure is performed in a conventional CVD chamber in which a wafer is heated to 350 deg C.–450 deg C. (preferably 390 deg C.) in vacuum. WF6 is admitted to the chamber at 1–40 Torr for 2 seconds to 5 minutes. After the test period, the WF6 is pumped out and the chamber is flushed with nitrogen, argon, helium or some similar non-reactive gas.

The inventive process may be used with a W conductive material as the interconnect, with Cu or Al as the interconnect, or any other interconnect material.

The inventive process may also be used in any inter-level dielectrics, including SILK and other low-k dielectrics.

The inventive process may also be used with TaN and CVD TiN cap layers on copper interconnects, which are required to confine the Cu to prevent it from migrating to the silicon transistors and ruining them. In that case, the reaction chemical agent can be copper fluoride.

Other reactive test gases are those that react with a material on the other side of the liner; i.e. with the inter-level dielectric or with the Cu or other materials being confined by the liner. For example, HCl or HBr may be used in the case of Cu to test the liner strength. In general, the requirements are that the test gas be one that reacts with material below the liner, or defects within the liner, or the material underneath the material on the far side of the liner—with the inter-level dielectric when testing the lower portion of a liner and with the interconnect material (e.g. Cu) when testing the cap layer or upper layer of the liner. Another requirement is that the reactant leave a readily observable trace—either a solid reaction product or an enlarged hole. Some degree of reaction between the test gas and the liner material is acceptable provided that the test exposure can be adjusted so that a defect-free area of the liner is not removed during the test. Those skilled in the art will appreciate that, if a robust liner is stripped, then the wafer will always fail the test. On the other hand, if a robust area of the liner is merely reduced in thickness, the inventive test may still be used to provide its benefits of quick feedback even if the test wafer must be discarded or reworked.

Figure 3:
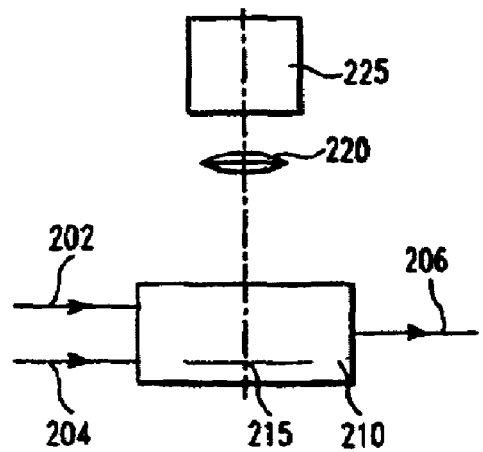
FIG. 3 illustrates an apparatus for performing the invention.

FIG. 3 shows in partially schematic, partially pictorial form components of an apparatus for practicing the invention. Illustratively, the invention may be practiced in a CVD or other chamber suitable for exposing the wafer to the reactant gas and then in an optical tool for examining wafers. Another advantageous feature of the invention is that no new tool is required. The tools could be combined in an apparatus having components similar to those illustrated, if there is a sufficient market.

At the center of the Figure, box 210 represents a CVD reaction chamber that has been used to deposit liner 120 of FIG. 1. Line 202 on the left represents the input for WF6 and line 204 represents the input for the flushing gas, e.g. nitrogen, argon, etc. Line 206 on the right represents the line for exhausting the gas. Other components, such as pumps, RF coils for plasma enhancement, etc. are omitted for simplicity. Wafer 210 has had a layer of liner 120 deposited on it in a conventional reaction that may or may not involve WF6.

According to the invention, WF6 or other reactant gas is introduced for a time empirically determined to be suitable for the combination of liner material, thickness, temperature used in the particular process to deposit the liner being tested. The reactant gas is maintained in the chamber for a reactant time and then flushed out.

The wafer is inspected to determine the number of fails by any convenient means. An automated system is preferred to manual inspection for speed and consistency in result. Illustratively, a KLA-Tencor 2132 optical inspection tool that has been programmed to carry out the Photo-Limited Yield (PLY) process is used. This known process was developed to identify dust particles, other contaminants, and undesired structures. It proceeds by comparing groups of adjacent/neighboring chips on the wafer and recognizing areas in which one of the chips differs from the others. An empirical setup process will set a criterion for flagging a gas fail and ignoring other defects or irregularities on the wafer. The test result of the scan will be a number of fails on the wafer and a number of defective chips that will be compared with a criterion; e.g. if there are more than X fails, the process is out of specification and if more than Y chips are defective (having one or more fails), the wafer is reworked.

Figure 2:
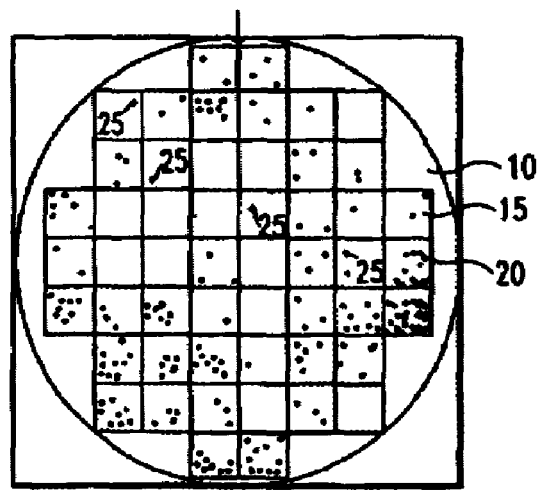
FIG. 2 illustrates the result of testing a wafer.

FIG. 2 shows a view of a test wafer 10, in which a number of chips 15 have been scanned. Defects induced by the test gas are denoted with numeral 25 and other irregularities are denoted collectively by numeral 20.

The scanning process may be carried out after a wet clean to remove solid reaction products and/or to enlarge gas-induced defects so they show up better. Also alternatively, the scan may be carried out before or after a chemical-mechanical polish operation to remove the liner material from the surface outside the trenches.

Those skilled in the art will appreciate that the invention is not limited to interconnect trenches in the back end, but may also be applied to any film, front end or back end. For example defects in the lining of a trench capacitor in a DRAM cell, or the gate insulator in a planar FET may be tested according to the invention. Any structure that requires durability or reliability may advantageously employ the invented test. As yet another illustration, if the inter-level dielectric is sufficiently porous or otherwise permits access to the liner, the top and bottom layers of a copper interconnect may be tested simultaneously, with the reactant gas probing the top liner directly from the ambient and probing the bottom and side layers by penetrating through the porous dielectric.

While the invention has been described in terms of a single preferred embodiment, those skilled in the art will recognize that the invention can be practiced in various versions within the spirit and scope of the following claims.

The invention claimed is:

1. A method of testing a structure in an integrated circuit, said method of testing not being part of a fabrication step in fabricating said integrated circuit, comprising the steps of:
providing an interconnect structure including a conductor and at least one blocking layer that covers a surface of a reactant material;
exposing said blocking layer of said interconnect structure, before said conductor is deposited, to a reactive gas that reacts with said reactant material for a testing period;
examining said blocking layer after said testing period for results produced by reaction between said reactant material and said reactive gas, establishing thereby a test result in said blocking layer directly related to said results produced by said reaction; and
comparing said test result with a criterion.

2. A method according to claim 1, in which said step of examining is performed in an automated optical system that compares an image of said blocking layer in said structure with at least one image of a neighboring structure.

3. A method of testing a structure in an integrated circuit comprising the steps of: providing an interconnect structure with at least one blocking layer on a surface of a reactant material;
exposing said blocking layer of said interconnect structure to a reactive gas that reacts with said reactant material for a testing period;
examining said blocking layer after said testing period for results produced by reaction between said reactant material and said reactive gas, establishing thereby a test result in said blocking layer directly related to said results produced by said reactant gas; and
comparing said test result with a criterion;
in which said structure is a damascene structure embedded in a dielectric that comprises said reactant material and said blocking material is a liner in said damascene structure.

4. A method according to claim 3, in which said interconnect structure is W, said reactant material is oxide and said reactant gas is WF6.

5. A method according to claim 2, in which said structure is a damascene structure embedded in a dielectric that comprises said reactant material and said blocking material is a liner in said damascene structure.

6. A method according to claim 2, in which said reactant material is selected from the group comprising silicon, free Ti, Cu and said reactant gas is selected from the group comprising WF6, HCl, HBr, CHF3 and HF.

7. A method according to claim 6, in which said interconnect structure is W, said reactant material is selected from the group comprising silicon, free Ti, Cu and said reactant gas is WF6.

8. A method of testing a layer in an integrated circuit, said method of testing not being part of a fabrication step in fabricating said integrated circuit, comprising the steps of:
providing a blocking layer that covers a surface of a reactant material;
exposing said blocking layer to a reactive gas that reacts with said reactant material, for a testing period;
examining said blocking layer after said testing period for results produced by reaction between said reactant material and said reactive gas, establishing thereby a test result in said blocking layer directly related to said results produced by said reactant gas; and
comparing said test result with a criterion.

9. A method according to claim 8, in which said step of examining is performed in an automated optical system that compares an image of said blocking layer in said structure with at least one image of a neighboring structure.

10. A method of testing a layer in an integrated circuit comprising the steps of: providing a blocking layer on a surface of a reactant material;
exposing said blocking layer to a reactive gas that reacts with said reactant material, for a testing period;
examining said blocking layer after said testing period for results produced by reaction between said reactant material and said reactive gas, establishing thereby a test result; and
comparing said test result with a criterion in which said step of examining is performed in an automated optical system; and said reactant material is selected from the group comprising silicon, free Ti, Cu and said reactant gas is selected from the group comprising WF6, HCl, HBr, CHF3 and HF.

11. A method according to claim 10, in which said interconnect structure is W, said reactant material is selected from the group comprising silicon, free Ti and said reactant gas is WF6.

12. A method according to claim 9, in which said reactant material is a silicon body of a FET and said blocking material is the gate insulator of the FET.

13. A method according to claim 12, in which said reactant material is a silicon body of a FET and said blocking material is the gate insulator of the FET.

14. A method according to claim 9, in which said structure is a trench capacitor embedded in a silicon layer that comprises said reactant material and said blocking material is a capacitor dielectric.

15. A method of forming an integrated circuit, said method of testing not being part of a fabrication step in fabricating said integrated circuit, comprising forming a set of front end structures in a plurality of integrated circuits on a semiconductor wafer and forming a set of interconnects connecting said front end structures; and testing a layer in one of said front end structures or interconnects and comprising the steps of:
providing a blocking layer that covers a surface of a reactant material;
exposing said blocking layer to a reactive gas that reacts with said reactant material, for a testing period;
examining said blocking layer after said testing period for results produced by reaction between said reactant material and said reactive gas, establishing thereby a test result in said blocking layer directly related to said results produced by said reactant gas;
comparing said test result with a criterion; and completing said plurality of integrated circuits in said semiconductor wafer.

16. A method according to claim 15, in which said step of examining is performed in an automated optical system that compares an image of said blocking layer in said structure with at least one image of a neighboring structure.

17. A method according to claim 15, in which a wafer that has not met said criterion is reworked before said step of completing.

18. A method according to claim 16, in which a wafer that has not met said criterion is reworked before said step of completing.

19. A method according to claim 15, in which said reactant material is a copper interconnect and said blocking layer is a cap layer on said copper interconnect.

* * * * *